(12) United States Patent
Lou et al.

(10) Patent No.: US 7,253,646 B2
(45) Date of Patent: Aug. 7, 2007

(54) PROBE CARD WITH TUNABLE STAGE AND AT LEAST ONE REPLACEABLE PROBE

(75) Inventors: Choon-Leong Lou, Singapore (SG); Mei-Shu Hsu, Bade (TW)

(73) Assignee: Star Technologies Inc. (TW)

( * ) Notice: Subject to any disclaimer, the term of this patent is extended or adjusted under 35 U.S.C. 154(b) by 0 days.

(21) Appl. No.: 10/906,076

(22) Filed: Feb. 2, 2005

(65) Prior Publication Data
US 2005/0174133 A1 Aug. 11, 2005

(30) Foreign Application Priority Data
Feb. 11, 2004 (TW) .............................. 93103194 A

(51) Int. Cl.
*G01R 31/02* (2006.01)
(52) U.S. Cl. ..................................... 324/754
(58) Field of Classification Search ...................... None
See application file for complete search history.

(56) References Cited
U.S. PATENT DOCUMENTS

| | | | | |
|---|---|---|---|---|
| 3,599,093 A * | 8/1971 | Oates | ......................... | 324/762 |
| 4,045,737 A * | 8/1977 | Coberly | ...................... | 324/754 |
| 4,266,191 A * | 5/1981 | Spano et al. | ................. | 324/758 |
| 4,593,243 A * | 6/1986 | Lao et al. | ..................... | 324/754 |
| 4,731,577 A * | 3/1988 | Logan | ......................... | 324/754 |
| 5,329,226 A * | 7/1994 | Monnet et al. | ........... | 324/158.1 |
| 6,031,383 A * | 2/2000 | Streib et al. | ................. | 324/754 |
| 6,191,598 B1 * | 2/2001 | Hollman | ..................... | 324/758 |
| 6,198,299 B1 * | 3/2001 | Hollman | ..................... | 324/758 |
| 6,316,954 B1 * | 11/2001 | Venaleck et al. | ........... | 324/761 |
| 6,603,322 B1 * | 8/2003 | Boll et al. | ................... | 324/754 |
| 6,686,753 B1 * | 2/2004 | Kitahata | ..................... | 324/754 |
| 6,729,019 B2 * | 5/2004 | Grube et al. | .................. | 29/830 |
| 7,023,225 B2 * | 4/2006 | Blackwood | ................. | 324/754 |

* cited by examiner

*Primary Examiner*—Paresh Patel
(74) *Attorney, Agent, or Firm*—Connolly Bove Lodge & Hutz LLP

(57) ABSTRACT

The present probe card comprises a circuit board, a platform fixed on the circuit board, a tunable stage positioned on the platform, a probe carrier positioned on the tunable stage and at least one probe positioned on the probe carrier. The tunable stage comprises a stationary part positioned on the platform, a movable part for loading the probe carrier and a driving mechanism connecting the stationary part and the movable part. The probe carrier is positioned on the movable part and the relative position between the probe on the probe carrier and a DUT can be adjusted by the driving mechanism.

6 Claims, 3 Drawing Sheets

PROBE CARD WITH TUNABLE STAGE AND AT LEAST ONE REPLACEABLE PROBE

BACKGROUND OF THE INVENTION

1. Field of the Invention

The present invention relates to a probe card, and more particularly, to a probe card capable of adjusting the relative position between a probe on the probe card and a device under test (DUT).

2. Description of the Related Art

The probe card is manufactured according the specifications of the DUT such as pin count, pitch, pad size and the probe depth of the testing machine. To test the electrical property of the DUT, the probe of the probe card transmits the testing signal from the testing machine to the DUT and transmits the measured electrical parameters for analyzing the electrical property back to the testing machine.

FIG. 1 is a cross-sectional view of a probe card 10 according to the prior art. As shown in FIG. 1, the probe card 10 comprises a circuit board 12, a supporter 14 positioned on the circuit board 12, a plurality of probes 16 fixed on the supporter 14, and the conductive through hole 20 electrically connects to the probe 16 and a conductive wire 26. In order to prevent the lateral position of the probe 16 from shifting as the use time increases, the probe 16 is fixed firmly on the supporter 14 by an epoxy resin 24. When the testing is carried out, the probe card 10 is placed on a testing machine (not shown in the FIG. 1) and the probe 16 electrically contacts a signal pad 38 of a DUT 30 to transmit the testing signal for the electrical property parameter.

However, the prior art probe card possesses the following defects:

The conventional probe card 10 can only be applied to a specific DUT: because the conventional probe card 10 is customized according to the specifications of the DUT 30 and the testing machine and uses the epoxy resin 24 to fix the probe 16 on the circuit board 12, the probe card 10 can only be applied to the specific DUT as the manufacture processing of the probe card 10 is completed. If the DUT is designed with a new specification of probe arrangement and pitch, a new probe card conforming to the new specification must be manufactured, which greatly increases the testing cost.

The probe position lacks adjusting flexibility: the probe position of the conventional probe card 10 is fixed on the circuit board 12 by the epoxy resin 24 after the technique personnel of the probe card manufacturer completes the position tuning. If the transportation of the probe card 10 or the careless use results in the shifting of the horizontal position, users must send the probe card 10 back to the original manufacturer for calibration, i.e., the conventional probe card 10 lacks the flexibility for the user to perform adjustment.

The entire probe card should be discarded in case a single probe is damaged: the conventional probe card 10 uses the epoxy resin 24 to fix the probe on circuit board 12 according to the designed position. When one probe or several probes are damaged, a new probe card must be manufactured again. The overall probe position level will be seriously affected even if the probe replacement is carried out since the replacement needs to remove the epoxy resin 24. Consequently, the accuracy of the testing result is influenced.

The single-function testing can not meet the future application requirements: the conventional probe card 10 can only carry out the testing for a single function of the DUT, such as the testing of DC (Direct Current) electrical property or AC (Alternative Current) electrical property. Facing the demands of the future RF (Radio Frequency) devices, the probe card manufacturer attempts to incorporate the RF probe and the DC probe in a single probe card, wherein the RF probe and the DC probe remain fixed on the probe card by the epoxy resin. However, the probe card still cannot meet the required frequency for testing the RF device because of the difference between the material property of the RF probe, the DC probe and the epoxy resin. Therefore, the current electrical property testing of the RF device is still carried out by separating the DC parameter testing and the RF parameter testing, which increases the testing time by 2 to 3 times.

SUMMARY OF THE INVENTION

The primary objective of the present invention is to provide a probe card capable of adjusting the relative position between a probe on the probe card and a DUT.

The secondary objective of the present invention is to provide a multi-application probe card, which can simultaneously measure the RF electrical property and the DC electrical property of a DUT.

In order to achieve the above-mentioned objective, and avoid the problems of the prior art, the present probe card comprises a circuit board, a platform fixed on the circuit board, a tunable stage positioned on the platform, a probe carrier positioned on the tunable stage and at least one probe positioned on the probe carrier. The tunable stage comprises a stationary part positioned on the platform, a movable part for loading the probe carrier and a driving mechanism connecting the stationary part and the movable part. The probe carrier is positioned on the movable part and the relative position between the probe on the probe carrier and a DUT can be adjusted by the driving mechanism. In addition, the present probe card further comprises a shielding cover positioned on the circuit board in such a manner that the electronic devices on the circuit board is covered inside to form a shield effect, which prevents the noise generated by the testing machine from interfering the electronic devices to ensure the reliability of the testing.

According to the second embodiment of the present invention, a probe card comprises a circuit board, at least a first probe, a tunable stage positioned on one surface of the circuit board for adjusting the relative position between the first probe and a DUT, a supporter positioned on the other surface of the circuit board and at least one DC probe positioned on the supporter. One end of the DC probe can electrically contact the DUT, and the other end penetrates through the circuit board to the surface where the tunable stage is positioned. In addition, the DC probe is substantially encapsulated by a ferrite bead to avoid the occurrence of oscillation. The first probe can be an RF probe, and the probe card can simultaneously measure the RF electrical property and the DC electrical property of the DUT by the RF probe and the DC probe.

Compared with the prior art, the present invention possesses the following advantages:

Tunable RF probe position: the present invention not only provides the user with flexibility to adjust the horizontal level of the RF probe, but also can adjust the position of the probe according the arrangement and pitch of the DUT and the specification of the testing machine so that the probe card can be applied to the device of different specifications.

Possessing multi-function testing and meeting the industry requirements: because the RF probe is positioned on the precise tunable stage and the DC probe is fixed by the traditional fixing method (epoxy resin) to avoid the influence due to the material difference, the probe card of the present invention can measure the DC electrical property and RF electrical property of the DUT simultaneously.

Replaceable RF probe: because the RF probe is positioned on the probe carrier in a replaceable manner, only the damaged probe has to be replaced when a single probe is damaged rather than to discard the entire probe card. In addition, the probe card of the present invention can also replace the probes with different functions such as optical fiber probe, etc., for applying to the testing of different devices.

Firm probe setting: the present invention uses multi-point positioning and fixing design; therefore the tunable stage, the probe carrier and the RF probe can be positioned on the circuit board correctly and firmly.

Excluding the environmental noise interference: the present invention contains the electronic devices on the circuit board inside the shielding cover to form the shielding effect and exclude the noise interference generated from the testing machine.

Avoiding the occurrence of oscillation: the DC probe of the probe card is encapsulated by the ferrite bead so that the DC probe can be used to test the DC electrical property without the occurrence of oscillation during carrying out the testing.

BRIEF DESCRIPTION OF THE DRAWINGS

Other objectives and advantages of the present invention will become apparent upon reading the following description and upon reference to the accompanying drawings in which.

DETAILED DESCRIPTION OF THE INVENTION

Figure 1:
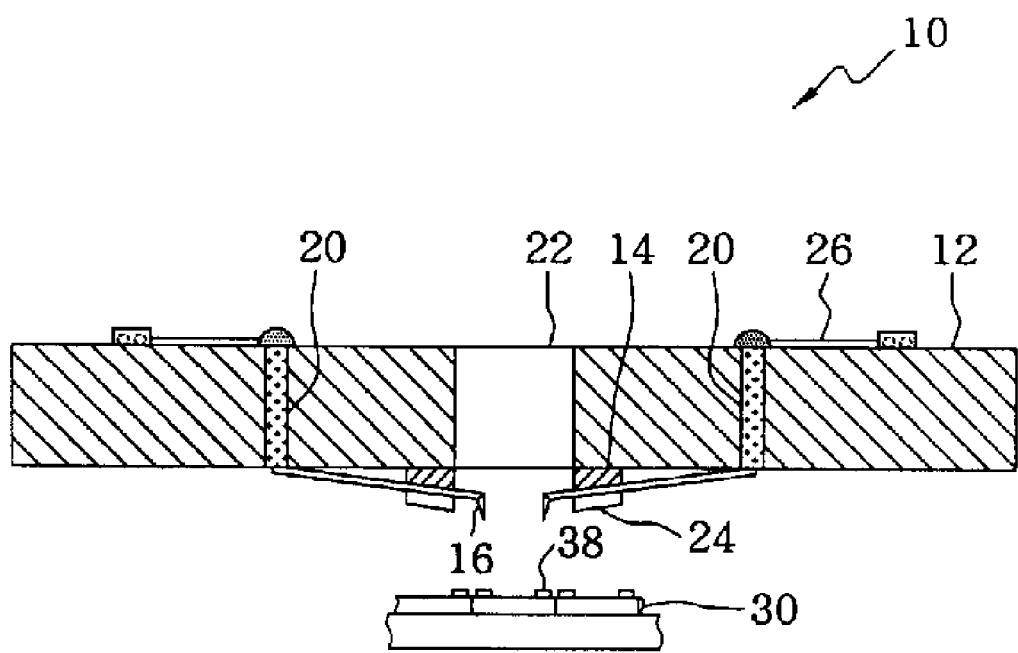
FIG. 1 is a cross-sectional view of a probe card according to the prior art.
Figure 2:
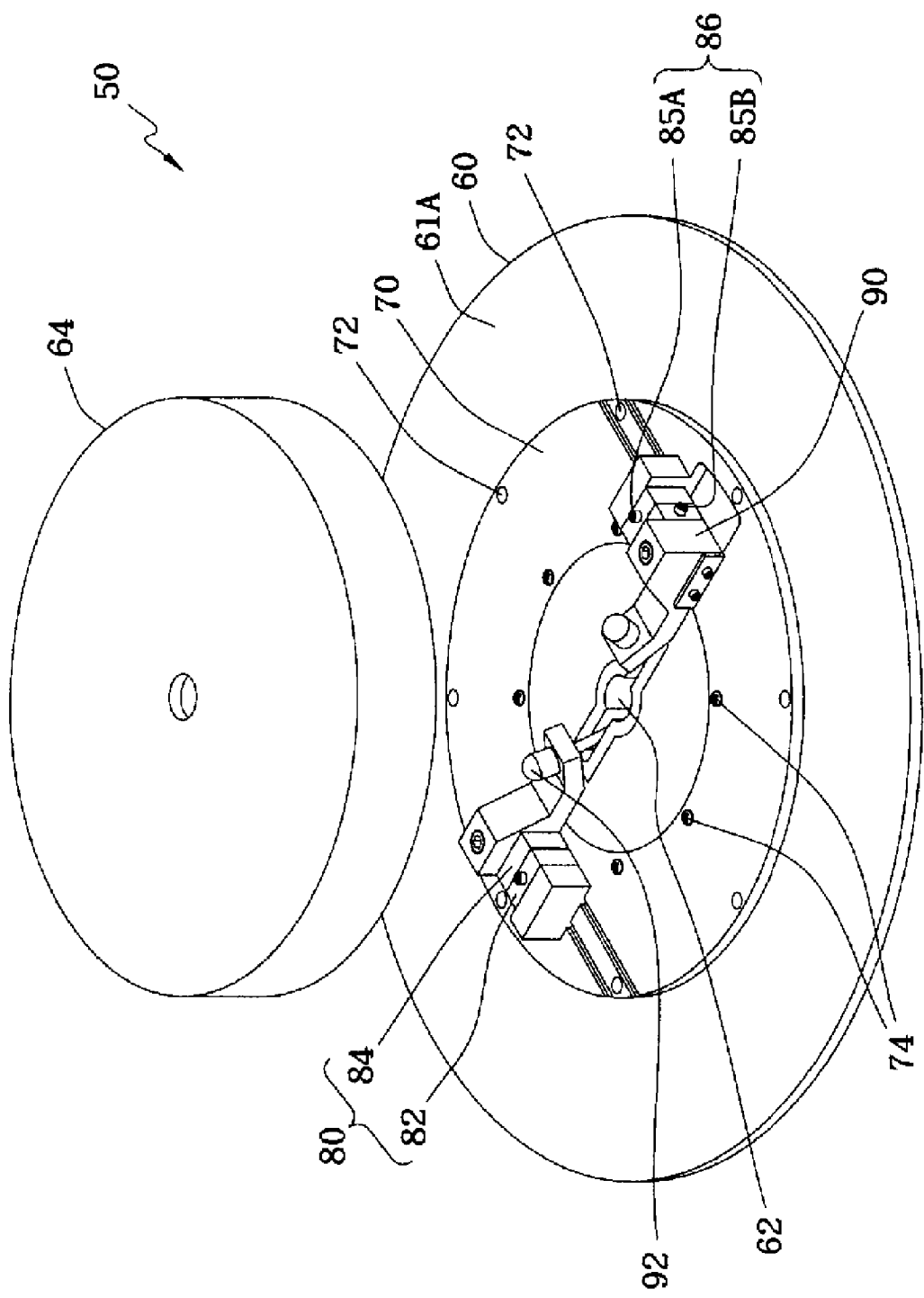
FIG. 2 is a schematic diagram of a probe card according to the present invention.

FIG. 2 is a schematic diagram of a probe card 50 according to the present invention. As shown in FIG. 2, the probe card 50 comprises a circuit board 60, a platform 70 fixed on the first surface 61A of the circuit board 60, a tunable stage 80 positioned on the platform 70, a probe carrier 90 positioned on the tunable stage 80 and at least one High Frequency Probe such as the RF probe 92 positioned on the probe carrier 90. The circuit board 60 includes an aperture 62, and the RF probe 92 can electrically contact a DUT (not shown in FIG. 2) through the aperture 62.

The platform 70 includes a plurality of positioning holes 72 and a plurality of fixing holes 74. The positioning hole 72 is used to check the relative position between the platform 70 and the circuit board 60, and the platform 70 can be fixed on the circuit board 60 firmly by fixing elements such as screws or rivets passing the fixing hole 74. By way of multi-point positioning and fixing of the platform 70, the tunable stage 80, probe carrier 90 and RF probe 92 can be firmly and accurately positioned on the circuit board 60 to prevent the relative position between the RF probe 92 and the DUT from shifting easily by an external force.

The tunable stage 80 includes a stationary part 82, a movable part 84 and a driving mechanism 86 connecting the stationary part 82 and the movable part 84. The stationary part 82 is fixed on the platform 70, the probe carrier 90 is positioned on the movable part 84, and the driving mechanism 86 can adjust the relative position between the RF probe 92 and the DUT. The driving mechanism 86 includes a first driving unit 85A and a second driving unit 85B, wherein the first driving unit 85A is used to adjust the vertical position of the RF probe 92 and the second driving unit 85B is used to adjust the radial position of the RF probe 92 along the probe card 60.

FIG. 2 illustrates the driving mechanism 86 capably of adjusting the vertical position and radial position of the RF probe 92, one skilled in the art should appreciate that the driving mechanism 86 can be designed as the one-dimensional driving, two-dimensional driving, three-dimensional driving, or angle adjustment according to the application requirements.

The accurate electrical property testing (especially for high frequency electrical property) must exclude the environmental noise from interfering the testing system. The probe card 50 of the present invention can further include a first shielding cover 64 positioned on the first surface 61A of the circuit board 60 to avoid the noise interference. The first shielding cover 64 contains the electronic device such as the RF probe 92 on the first surface 61A of the probe card 50 inside so as to form a shielding effect, which can exclude the noise originated from the testing machine or the environment for ensuring the testing accuracy.

Figure 3:
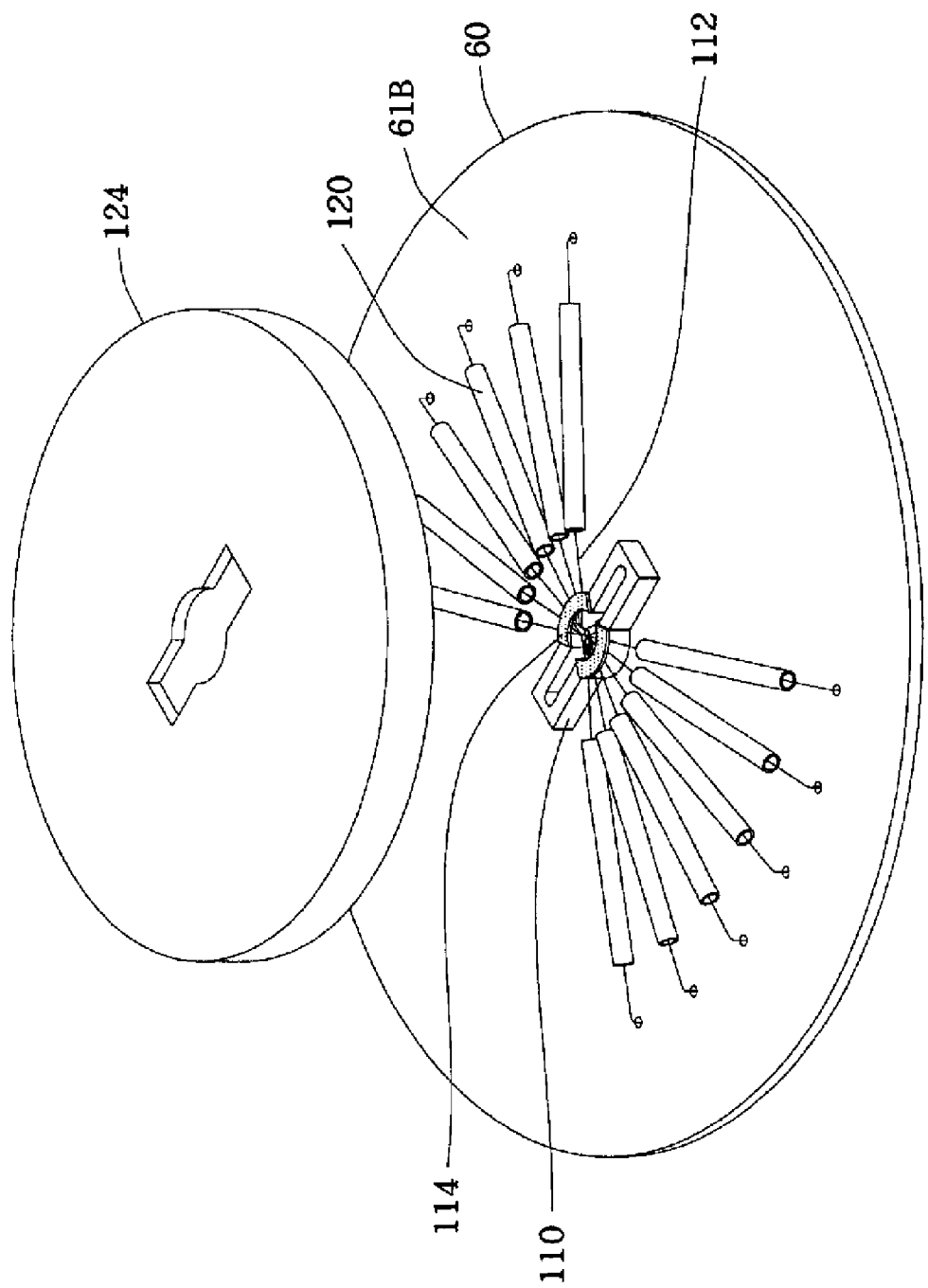
FIG. 3 is a back three-dimensional view of the probe card according to the present invention.

FIG. 3 is a back three-dimensional view of the probe card 50 according to the present invention. As shown in FIG. 3, the probe card 50 further includes a supporter 110 positioned on the second surface 61B of the circuit board 60 and at least one DC probe 112 fixed on the supporter 110 by an epoxy resin 114. The DC probe 112 of the probe card 50 is substantially encapsulated by a ferrite bead 120 so that the DC probe 112 can be used to measure the DC electrical property without the occurrence of oscillation during carrying out the testing. Since one end of the DC probe 112 can electrically contact the DUT and the other end penetrates through the circuit board 50 to the first surface 51A of the circuit board 50, the ferrite bead 120 can be positioned very closely to the tip of the DC probe 112 to avoid the occurrence of oscillation more effectively. Consequently, the probe card 50 can measure the RF electrical property and DC electrical property of the DUT simultaneously by the RF probe 92 and the DC probe 112.

In order to avoid the noise interference, the probe card 50 can further include a second shielding cover 124 positioned on the second surface 61B of the circuit board 60. The second shielding cover 124 contains the electronic device such as the DC probe 112 on the second surface 61B of the probe card 50 inside to form a shielding effect, which prevents the noise generated by the testing machine or the environment from interfering the electronics to ensure the reliability of the testing.

Compared with the prior art, the present invention possesses the following advantages:

Tunable RF probe position: the RF probe 92 is positioned on the probe carrier 90, and the relative position between the RF probe 92 and the DUT can be adjusted by the tunable stage 80. The present invention not only provides the user with flexibility to adjust the horizontal level of the RF probe 92, but also can adjust the position of the probe according the arrangement and pitch of the DUT and the specification of the testing machine so that the probe card 50 can be applied to the device of different specifications.

Possessing multi-function testing and meeting the industry requirements: the present invention fixes the RF probe 92 and the DC probe 112 individually to prevent the electrical property of the RF probe 92 from being influenced due to the material difference between the epoxy resin 114 and the DC probe 112. Because the RF probe 92 is positioned on the precise tunable stage 80 and the DC probe 112 is fixed by the traditional fixing method (epoxy resin) to avoid the influence of material difference, the probe card 50 of the present invention can measure the DC electrical property and RF electrical property of the DUT simultaneously to shorten the testing time.

Replaceable RF probe: because the RF probe 92 is positioned on the probe carrier 90 in a replaceable manner, only the damaged probe has to be replaced when a single probe is damaged rather than to discard the entire probe card. In addition, the probe card 50 of the present invention can also replace the probes with different functions such as optical fiber probe for applying to the testing of different devices.

Firm probe setting: the present invention uses multi-point positioning and fixing design to firmly position the RF probe 92 on the specified position of the probe card 50. Consequently, the tunable stage 80, the probe carrier 90 and the RF probe 92 can be positioned on the circuit board 50 correctly and firmly to prevent the probe from shifting by the external force.

Excluding the environmental noise interference: the present invention contains the electronic devices on the circuit board 60 inside the shielding cover 64 and 124 positioned on the circuit board 50 to form the shielding effect and exclude the noise interference generated from the testing machine and ensure the testing accuracy.

Avoiding the occurrence of oscillation: the DC probe 112 of the probe card 50 is encapsulated by the ferrite bead 120 so that the DC probe 112 can be used to test the DC electrical property without the occurrence of oscillation during carrying out the testing. In addition, because the DC probe 112 penetrates through the circuit board 50 to the first surface 51A of the circuit board 50, the ferrite bead 120 can be positioned very closely to the tip of the DC probe 112 to avoid the occurrence of oscillation more effectively.

The above-described embodiments of the present invention are intended to be illustrative only. Numerous alternative embodiments may be devised by those skilled in the art without departing from the scope of the following claims.

What is claimed as new and desired to be protected by Letters Patent of the United States is:

1. A probe card, comprising:
   a circuit board having at least one conductive through hole and at least one conductive wire;
   a platform positioned on the circuit board;
   a tunable stage positioned on the platform;
   a probe carrier positioned on the tunable stage; and
   at least one probe positioned on the probe carrier, wherein the tunable stage is configured to adjust the relative position between the probe and a device under test,
   wherein the circuit board comprises an aperture and the probe can electrically contact a device under test through the aperture, wherein the tunable stage comprises:
   a stationary part positioned on the platform;
   a movable part for loading the prober carrier; and
   a driving mechanism connecting the stationary part and the movable part for adjusting the relative position between the probe and a device under test.

2. The probe card of claim 1, wherein the platform comprises a plurality of first holes for positioning the platform onto the circuit board.

3. The probe card of claim 1, wherein the platform comprises a plurality of second holes for fixing the platform onto the circuit board.

4. The probe card of claim 1, further comprising a shielding cover positioned on the circuit board for preventing noise interference.

5. The probe card of claim 1, wherein the probe is positioned on the probe carrier in a replaceable manner.

6. The probe card of claim 1, wherein the probe is a high frequency probe or an optical fiber probe.

* * * * *